United States Patent [19]

Shimoji et al.

[11] Patent Number: 5,233,219
[45] Date of Patent: Aug. 3, 1993

[54] THREE-DIMENSIONAL SEMICONDUCTOR DEVICE STRUCTURE

[75] Inventors: Noriyuki Shimoji; Hidemi Takasu, both of Kyoto, Japan

[73] Assignee: Rohm Co., Ltd., Kyoto, Japan

[21] Appl. No.: 863,266

[22] Filed: Apr. 3, 1992

[30] Foreign Application Priority Data

Oct. 30, 1991 [JP] Japan .................. 3-285000

[51] Int. Cl.⁵ .................. H01L 29/72; H01L 29/06
[52] U.S. Cl. .................. 257/623; 257/618; 257/621; 257/626; 257/536
[58] Field of Search .................. 357/35, 34, 55; 257/618, 622, 621, 623, 626

[56] References Cited

U.S. PATENT DOCUMENTS 4,772,929 9/1988 Manchester .................. 357/55

Primary Examiner—Rolf Hille
Assistant Examiner—Wael Fahmy
Attorney, Agent, or Firm—Lowe, Price, LeBlanc & Becker

[57] ABSTRACT

A semiconductor device and a method of manufacture thereof by which circuit elements are readily formed as a three-dimensional structure without increasing the device size are provided. An $N^{31}$ type epitaxially grown layer (4) is first formed on a $P^{30}$ type silicon substrate (2), and then a $P^{30}$ type diffusion layer (31), an emitter layer (32) ($P^{30}$ type) and an $N^{30}$ type diffusion layer (33) are formed in the $N^{31}$ type epitaxially grown layer (4). Next, an underside of the substrate (2) is etched to form a bottom recessed part (6), from which a collector region (8) (P+type) is formed in such a manner that it reaches the P+type diffusion layer (31). Thus, a vertical PNP type transistor is obtained readily. In this method, the collector region (8) is formed at a latter step, so that redistribution of the collector region (8) due to epitaxial growth can be avoided.

4 Claims, 5 Drawing Sheets

F I G. 2
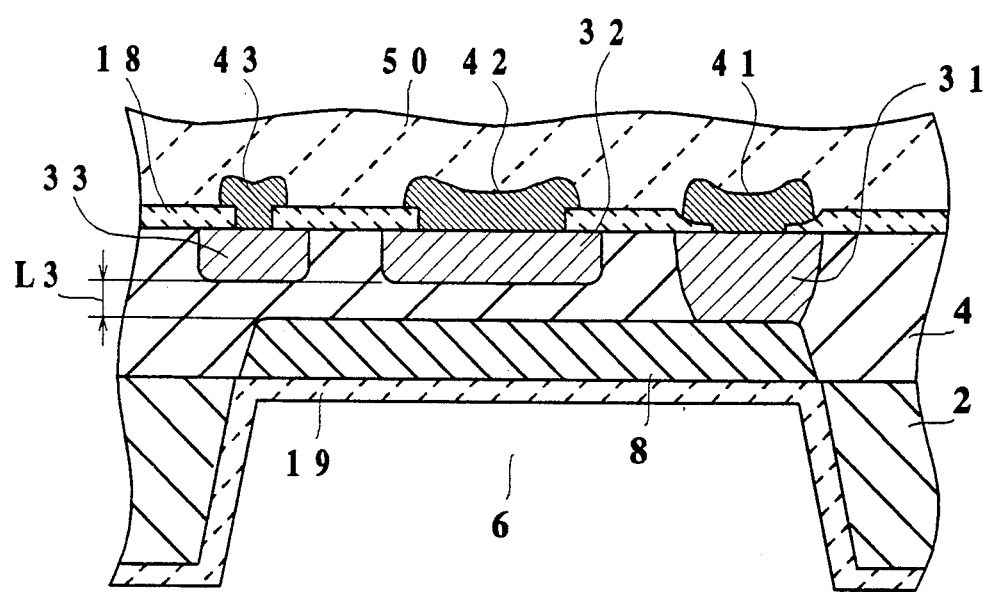

THREE-DIMENSIONAL SEMICONDUCTOR DEVICE STRUCTURE

BACKGROUND OF THE INVENTION

1. Field of the Invention

The present invention relates to a semiconductor device and a method of manufacture thereof, and more particularly, to a technique to readily form a three-dimensional structure of the device.

2. Description of the Prior Art

In semiconductor devices used in semiconductor integrated circuits or the like, the way of forming a desired circuit is usually such that impurities like ions are first implanted into the surface of a silicon substrate, and then diffused to form the device. The devices thus obtained are generally formed only on the surface of the silicon substrate, arranged in the lateral direction (lateral device). As a result, a current conducting region is limited to the surface area of the silicon substrate, allowing the resulting circuit to have a low efficiency in device forming and wiring. In order to solve this problem, a way of forming devices in the vertical direction (vertical device) has been proposed. This method is to form devices at a right angle to the surface of the substrate, thus obtaining a high efficiency in device forming and wiring.

FIG. 1 shows a method for manufacturing a conventional vertical PNP type transistor. According to this method, impurities are first implanted into a P type silicon substrate 75 through an oxide layer 79. The implanted ions are then diffused to form an $N^{30}$ type separation layer 81 which acts as buried layer for use in device separation (FIG. 1A).

The N+type separation layer 81 is next subjected to impurities implantation, and thereafter heated at a high temperature. This heat treatment allows the implanted ions to be diffused to form a P+type buried layer 77 on the N+type separation layer 81, whereas an $N^{31}$ type epitaxially grown layer 4 is grown on the P type silicon substrate 75. Thus, the $P^{30}$ type buried layer 77 acting as collector layer is provided between the P type silicon substrate 75 and the N−type epitaxially grown layer 4.

Further, by means of photoetching method (photoresist), a P+type diffusion layer 82, an emitter layer ($P^{30}$ type) 84 and an N+type diffusion layer 86 are formed in the N−type epitaxially grown layer 4. Thereafter, a collector electrode 83, an emitter electrode 85 and a base electrode 87 are attached to the $P^{30}$ type diffusion layer 82, the emitter layer ($P^{30}$ type) 84 and the N+type diffusion layer 86, respectively.

By these processes, the PNP type transistor having the P+type buried layer 77, the N−type epitaxially grown layer 4 and the emitter layer (P+type) 84 is obtained. In this transistor, each device is arranged in the vertical direction so as to stand at a right angle (FIG. 1C, arrow 90) to the surface of the substrate, thus formed as a three-dimensional structure. This structure allows an efficient circuit.

The conventional semiconductor device, however, has the following disadvantages. The N+type separation layer 81 and the P+type buried layer 77 are lain between the P type silicon substrate 75 and the N−type epitaxially grown layer 4, as shown in FIG. 1C. In order to construct this structure, the N+type separation layer 81 and the P+type buried layer 77 are first formed, and thereafter the N−type epitaxially grown layer 4 are grown on the P type silicon substrate 75. The epitaxial growth at this step usually requires heating at 1000° C. or more. The heat treatment, however, is responsible for the following problem. Namely, impurities, contained in the N+type separation layer 81 and the P+type buried layer 77, are again made to diffuse and redistribute by the heat treatment. The effect of redistribution is such that it changes electrical characteristics of the transistor. Also, it increases the device size. Accordingly, a fine-tuned control is necessary to obtain the transistor of which circuit elements are constructed in three dimensions, having desired electrical characteristics.

SUMMARY OF THE INVENTION

An object of the present invention is to provide a semiconductor device and a method of manufacture thereof by which circuit elements are readily formed as a three-dimensional structure without increasing the device size.

According to a feature of the invention, there is provided a semiconductor device comprising:

a semiconductor substrate having a substrate surface and a bottom recessed part;

a top face region which is formed in the substrate surface so as to confront the bottom recessed part; and a bottom face region which is formed from the bottom recessed part.

According to a further feature of the invention, there is provided a method for manufacturing a semiconductor device comprising the steps of:

providing a semiconductor substrate having a substrate surface with a bottom recessed part;

forming a top face region in the substrate surface so as to confront the bottom recessed part; and forming a bottom face region from the bottom recessed part.

While the novel features of the invention are set forth in a general fashion, particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 2 is a cross-sectional view illustrating a PNP type transistor which is an embodiment of a semiconductor device of the present invention.

DESCRIPTION OF THE PREFERRED EMBODIMENT

A semiconductor device and a method of manufacture thereof according to an embodiment of the present invention is described below. FIG. 2 shows a cross-sectional view illustrating a PNP type transistor. FIGS. 3A-3C and FIGS. 4A-4C show a method for manufacturing the PNP type transistor shown in FIG. 2, which will be explained below in detail.

Figure 3A:
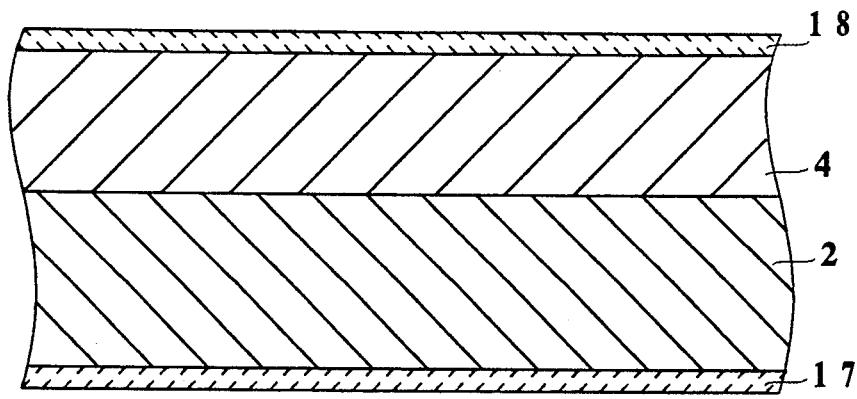
FIGS. 3A–3C are cross-sectional views illustrating steps for manufacturing the PNP type transistor shown in FIG. 2.
Figure 3B:
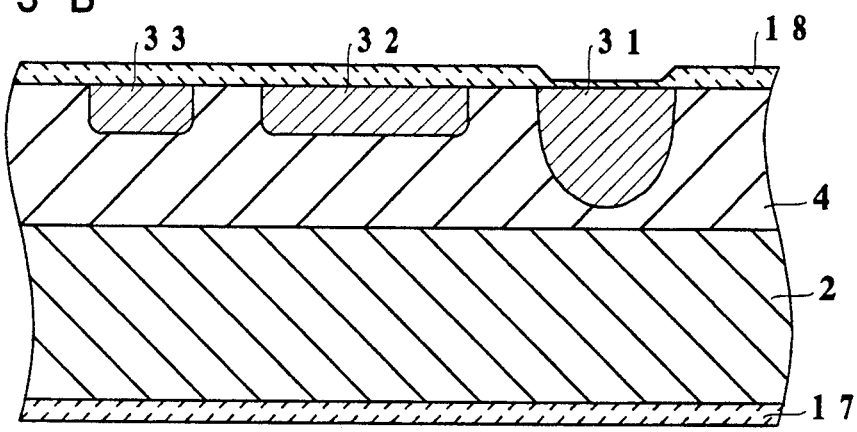

First, an N⁻type epitaxially grown layer 4 is grown on a P⁺type silicon substrate 2, as shown in FIG. 3A. Next, a top face insulating layer 18 and a bottom face insulating layer 17 are formed on a top face of the N⁻type epitaxially grown layer 4 and on a bottom face of the P⁺type silicon substrate 2, respectively. Further, a P⁺type diffusion layer 31, an emitter layer 32 (P⁺type) acting as top face region and an N⁺type diffusion layer 33 are formed in the N⁻type epitaxially grown layer 4 by ion diffusion, as shown in FIG. 3B. The purpose of forming the N⁺type diffusion layer 33 is to relieve the great difference in resistance value between the N⁻type epitaxially grown layer 4 and a base electrode 43 (FIG. 2) which will be formed later on.

Also, photoetching method (photoresist) is used in order to form the P⁺type diffusion layer 31, the emitter layer 32 and the N⁺type diffusion layer 33. In this method, a pattern is first formed on the surface of the N⁻type epitaxially grown layer 4 (not shown), and then impurities such as ions are implanted using the photoresist as a mask. The impurities, some of them being blocked by the mask, are implanted into the N⁻type epitaxially grown layer 4 according to the precedent pattern. The impurities thus reliably implanted into the desired position are then thermally diffused to form the P⁺type diffusion layer 31, the emitter layer 32 and the N⁺type diffusion layer 33.

Figure 3C:
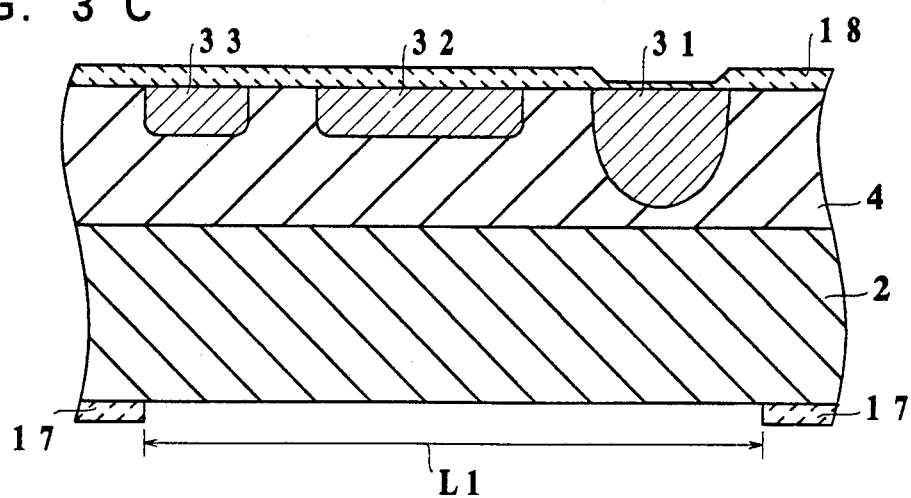
Figure 4A:
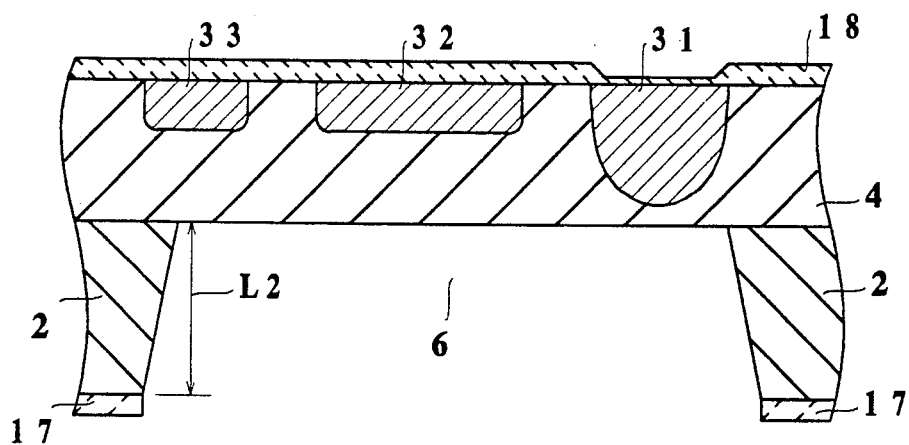
FIGS. 4A–4C are cross-sectional views illustrating further steps for manufacturing the PNP type transistor shown in FIG. 2.

Next, a part of the bottom face insulating layer 17 on the P⁺type silicon substrate 2 is removed to thereby an opening L1 is patterned (FIG. 3C). Further, a bottom recessed part 6 is formed from the opening L1 in the direction of the emitter layer 32 as shown in FIG. 4A, so that the emitter layer 32 acting as top face region is allowed to face the bottom recessed part 6. This is carried out by etching (chemical etching) by the use of such an alkaline solution as a KOH solution, or a mixed solution of hydrofluoric acid and nitric acid. Here, it is possible to strictly control an etched depth L2 of the bottom recessed part 6, because the etching rate varies depending on the density of impurities in the silicon substrate. This fact means that only the P⁺type silicon substrate 2 can be etched. As a result, it can be realized to accurately adjust a base width L3 (FIG. 2) as compared with a conventional transistor having lateral devices of which the base width varies according to a measurement error by lithography.

Figure 4B:
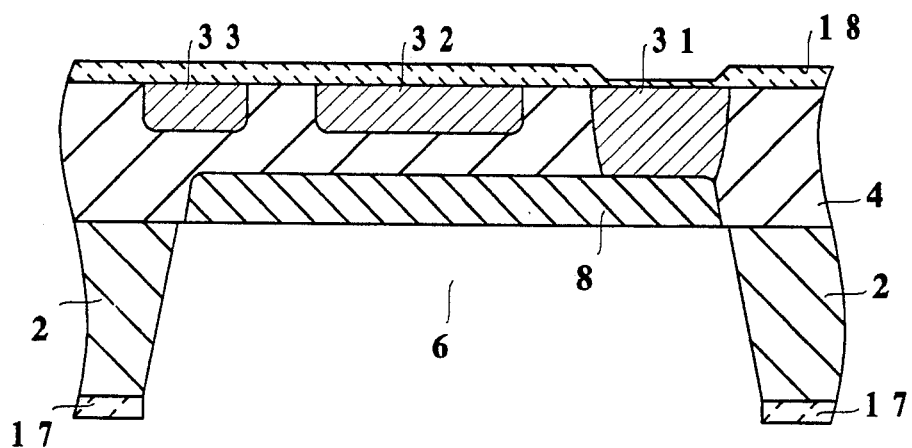
Figure 4C:
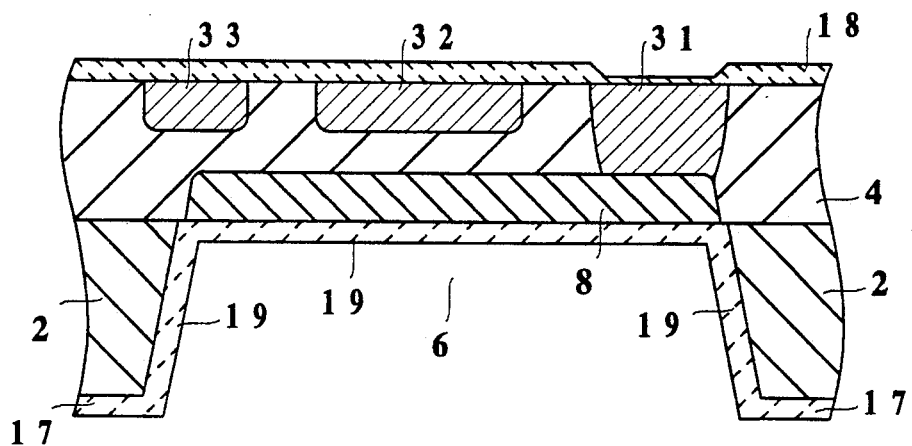

Subsequent to the bottom recessed part 6, a collector region 8 (P⁺type) which acts as bottom face region is formed in such a manner that it reaches the P⁺type diffusion layer 31 (FIG. 4B). Implantation of impurities and thermal diffusion are performed again to form the collector region 8. Thereafter, the bottom recessed part 6 is provided with a recess insulating layer 19 (FIG. 4C). Furthermore, a collector electrode 41, an emitter electrode 42 and a base electrode 43 are attached to the P⁺type diffusion layer 31, the emitter layer 32 and the N⁺type diffusion layer 33, respectively. This is followed by forming a passivation film 50 on the top face of the transistor, so that the PNP transistor shown in FIG. 2 is obtained.

Figure 1A:
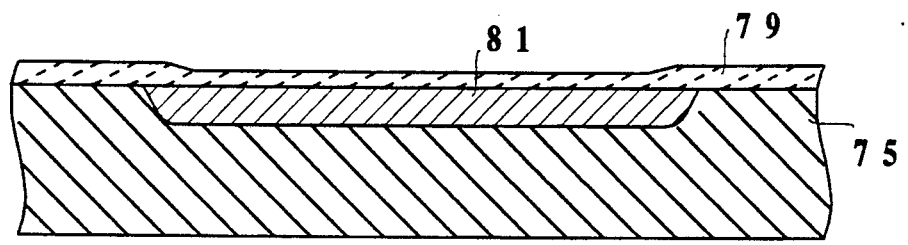
FIGS. 1A–1C are cross-sectional views illustrating steps in a manufacturing method of a conventional PNP type transistor.
Figure 1B:
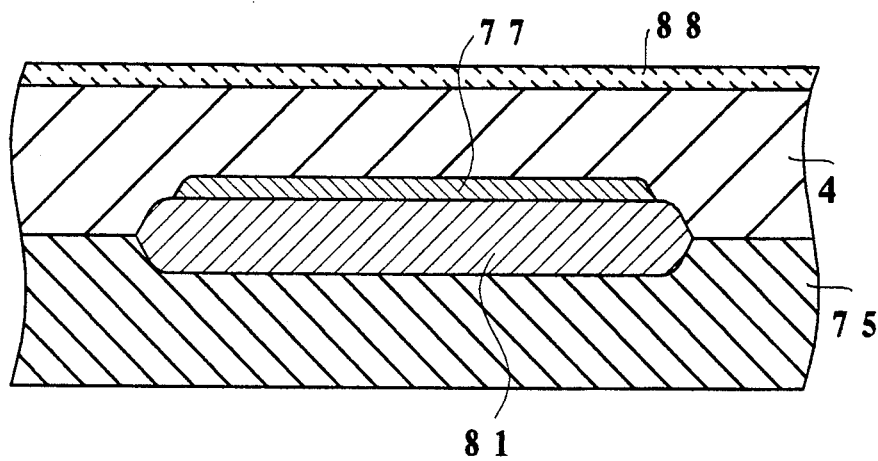
Figure 1C:
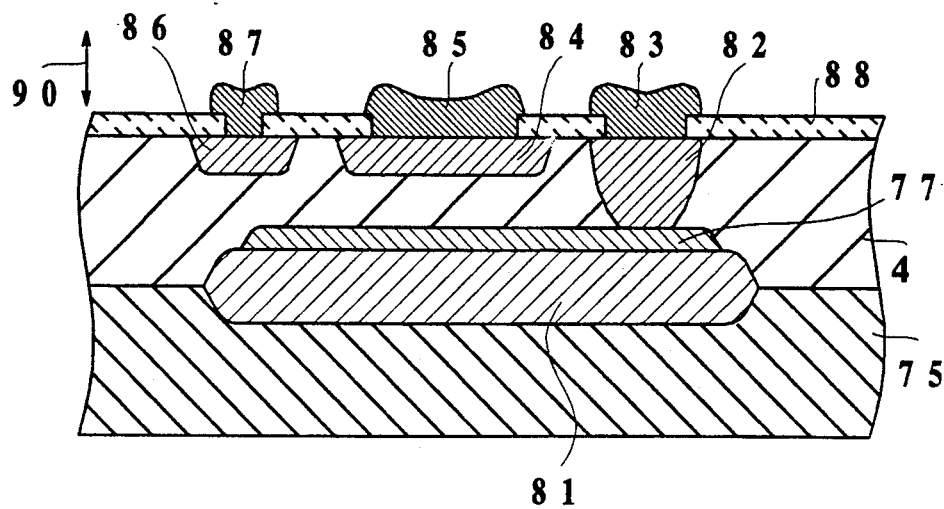

In the embodiment described above, the collector region 8 is formed from the bottom recessed part 6, enabling the three-dimensional structure of the device (vertical device) to be obtained readily. Further, contrary to the conventional vertical transistor shown in FIG. 1, there is no need to lay the P⁺type buried layer 77 between the N⁻type epitaxially grown layer 4 and the P⁺type silicon substrate 2 (FIG. 1B). This is because, in this embodiment, formation of the collector region 8 is already completed prior to the epitaxial growth and, therefore, it is possible to prevent impurities in the collector region 8 from redistributing.

Moreover, the P⁺type silicon substrate 2 which borders on the collector region 8 is removed by forming the bottom recessed part 6, so that parasitic capacitance resulting from a pn junction is avoided. In addition, this method does not allow the P⁺type silicon substrate 2 to be formed thin throughout, partly providing the substrate 2 with the bottom recessed part 6, and so the resulting semiconductor device holds a sufficient strength.

Figure 5A:
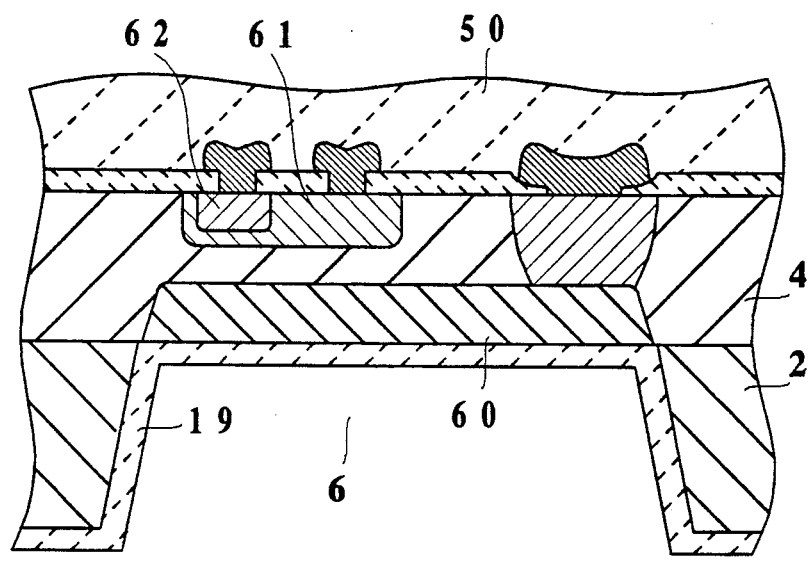
FIGS. 5A and 5B are cross-sectional views illustrating a NPN type transistor and a pinch resistor, respectively, which are other embodiments of semiconductor devices of the present invention.
Figure 5B:
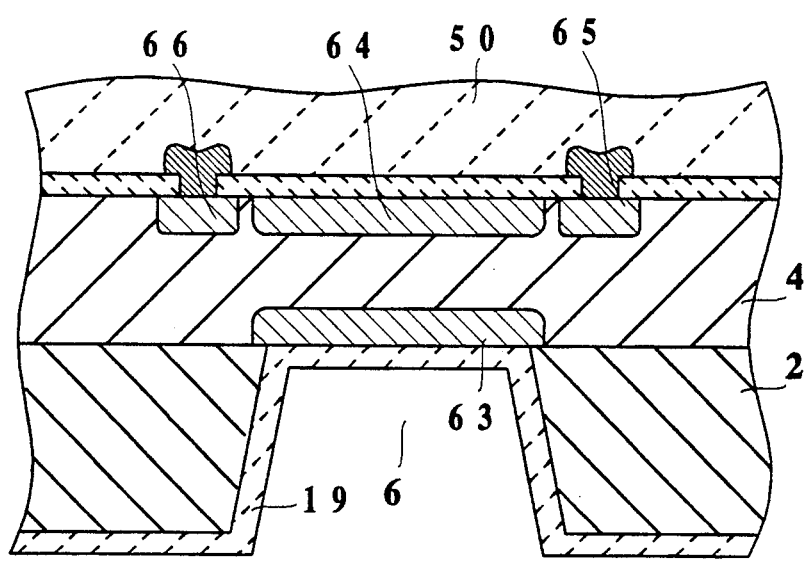

FIGS. 5A and 5B show other semiconductor devices manufactured in a similar manner. A vertical NPN type transistor is shown in FIG. 5A, and a pinch resistor is illustrated in FIG. 5B.

The vertical NPN type transistor in FIG. 5A have a structure in which the N⁻type epitaxially grown layer 4 is formed on the P⁺type silicon substrate 2, the N⁺type diffusion layer 60 being formed in the epitaxially grown layer 4. In addition, the base layer 61 (P type), in which the emitter layer 62 (N⁺type) is provided, is formed in the surface of the epitaxially grown layer 4. In the method for manufacturing the conventional NPN type transistor, antimony or the like is used as impurities for the buried layer in order to suppress the redistribution of the diffusion layer due to epitaxial growth. The diffusion layer of antimony, however, does not allow a satisfactory crystallinity, with the result that the reliability of the resulting transistor product is suppressed. On the contrary, the NPN type transistor shown in FIG. 5A does not need antimony or the like as impurities, thus overcoming the above-mentioned problem.

In FIG. 5B, diffusion layers 63 and 64, and elements 65 and 66 are formed as P⁺type and N⁺type, respectively.

In the semiconductor device of the present invention and the method of manufacture thereof of the present invention, the bottom face region is formed from the bottom recessed part, being placed under the top face region. Forming circuit elements in the bottom face region and the top face region, therefore, may allow easier process to obtain the semiconductor device having the circuit elements as a three-dimensional structure. Moreover, there is no need to perform epitaxial growth after a buried layer or the like is formed. Consequently, redistribution due to epitaxial growth can be avoided, the semiconductor device being prevented from increasing in size. Further, the bottom face region is formed from the bottom recessed part, so that the interface area of the bottom face region with the semiconductor substrate is reduced. As a result, parasitic capacitance resulting from a pn junction can be avoided, and so a high-speed device is realized.

Also, this method does not allow the semiconductor substrate to be formed thin throughout, partly providing the substrate with the bottom recessed part. As a result, the semiconductor device holds a sufficient strength, allowing the reliability of the resulting product to be improved.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A semiconductor device, comprising:
   a substrate having an upper main surface and a bottom surface;
   a first layer having a first impurity concentration formed on said upper main surface of said substrate, and first layer having a top surface and a bottom surface;
   an opening formed in said substrate exposing said bottom surface of said first layer;
   a first region having a second impurity concentration, different from said first impurity concentration, formed in said top surface of said first layer above the exposed said bottom surface;
   a top insulating layer formed on said top surface of said first layer;
   a second region having said second impurity concentration formed in substantially all of the exposed said bottom surface of said first layer; and
   a bottom insulating layer formed covering said bottom surface of said substrate, sidewalls of said substrate exposed in said opening, and the exposed said bottom surface of said first layer, wherein
   said first impurity concentration of said first layer interposes said first and second regions in a direction normal to said substrate.

2. The semiconductor device according to claim 1, wherein
   said first impurity concentration is an N-type conductivity and said second impurity concentration is a P-type conductivity, and
   said first and second regions, and said first layer comprise an PNP transistor.

3. The semiconductor device according to claim 1, further comprising a third region of P-type conductivity formed in said top surface of said first layer above the exposed said bottom surface, wherein
   said first region is formed in said third region,
   said first and second impurity concentrations are N-type conductivity, and
   said first, second and third regions, and said first layer comprise an NPN transistor.

4. The semiconductor device according to claim 1, wherein
   said first impurity concentration is an N-type conductivity and said second impurity concentration is a P-type conductivity, and
   said first and second regions, and said first layer comprise a pinch resistor.

* * * * *